United States Patent [19]

Tran et al.

[11] Patent Number: 5,828,592
[45] Date of Patent: Oct. 27, 1998

[54] ANALOG SIGNAL RECORDING AND PLAYBACK INTEGRATED CIRCUIT AND MESSAGE MANAGEMENT SYSTEM

[75] Inventors: Hieu Van Tran, San Jose; Nataraj S. Bindiganavale; Anthony Dunne, both of Cupertino, all of Calif.; Boyce W. Jarrett, Austin, Tex.

[73] Assignee: Information Storage Devices, Inc., San Jose, Calif.

[21] Appl. No.: 819,665

[22] Filed: Mar. 12, 1997

[51] Int. Cl.[6] .................................................. G11C 11/34
[52] U.S. Cl. .............................................. 365/45; 365/206
[58] Field of Search ........................ 365/45, 194, 189.01, 365/206

[56] References Cited

U.S. PATENT DOCUMENTS

| | | | |
|---|---|---|---|
| 4,112,384 | 9/1978 | Buchberger | 330/141 |
| 4,890,259 | 12/1989 | Simko | 365/45 |
| 4,989,179 | 1/1991 | Simko | 365/45 |
| 5,126,967 | 6/1992 | Simko | 365/45 |
| 5,164,915 | 11/1992 | Blyth | 365/45 |
| 5,220,531 | 6/1993 | Blyth et al. | 365/45 |
| 5,241,494 | 8/1993 | Blyth et al. | 365/45 |
| 5,243,239 | 9/1993 | Khan et al. | 328/167 |
| 5,294,819 | 3/1994 | Simko | 257/314 |
| 5,352,934 | 10/1994 | Khan | 365/45 |
| 5,388,064 | 2/1995 | Khan | 365/45 |
| 5,623,436 | 4/1997 | Sowards et al. | 365/45 |
| 5,625,584 | 4/1997 | Uchino et al. | 365/45 |
| 5,629,890 | 5/1997 | Engh | 365/185.03 |
| 5,631,606 | 5/1997 | Tran . | |

FOREIGN PATENT DOCUMENTS

| | | |
|---|---|---|
| 0 664 545 A2 | 7/1995 | European Pat. Off. . |
| 57-176598 | 10/1982 | Japan . |

*Primary Examiner*—Vu A. Le
*Attorney, Agent, or Firm*—Blakely, Sokoloff, Taylor & Zafman LLP

[57] ABSTRACT

An apparatus and method for message management using nonvolatile analog signal recording and playback is disclosed. The device is an integrated circuit with interface circuitry for use as a peripheral device to a microcontroller or a microprocessor-based system. The integrated circuit is complete with differential analog inputs, auto attenuation to improve signal quality, filter, fixed references including a band gap reference, trimming, memory array, multiple closed loop sample and hold circuits, column device, row decoder, address counters, master oscillator, chip function timing circuits, and a serial peripheral interface (SPI) and circuits on a single chip. The integrated circuit is interfaced with a host microcontroller through the SPI. The host microcontroller can send a number of commands to the integrated circuit through the SPI for efficient message management. These commands include the basic commands to record or playback and various addressing and message cueing options. The system utilizes redundancy to increase production yield. It also utilizes a high speed test mode to reduce production testing time.

27 Claims, 13 Drawing Sheets

ANALOG SIGNAL RECORDING AND PLAYBACK INTEGRATED CIRCUIT AND MESSAGE MANAGEMENT SYSTEM

BACKGROUND OF THE INVENTION

1. Field of the Invention

The present invention relates to the field of solid state message storage and playback devices, such as voice signal storage and playback.

2. Prior Art

Message management is generally implemented in storage and playback devices so that a limited amount of expensive storage medium may be efficiently utilized. The key concept behind message management is to logically connect all the available storage space into one contiguous space, even though the available storage space is physically fragmented in the storage medium. There are various techniques used in computer systems for the mass storage and retrieval of data files, with the message management capability normally being provided by the operating system.

For example, the ISD 1016 Single Chip Voice Message System manufactured by Information Storage Devices of San Jose, Calif., is an analog storage device which has the capability of sequentially sampling and storing in analog voltage level form, an analog signal such as a voice signal, and playing back the stored samples on command so as to reconstruct the voice signal with sufficient fidelity to provide quality voice message annunciation for phone answering machines and other electronically controlled voice message systems. The ISD 1016 is a highly versatile device, as it includes as part of the integrated circuit a preamp, AGC, anti-aliasing filter and nonvolatile solid state analog signal storage as well as all support circuitry required to sample and store a voice signal in analog form, and to play the same back on command. These devices may also be cascaded so that n devices may be used to provide n times the record and playback time of a single device without additional support circuitry.

In the ISD 1016, a voice message may terminate at the end of the storage space, or be earlier terminated by the recording of a unique end of message (EOM) signal which, once initiated, will terminate the playback at that point. This, plus the ability to address starting points for playback, allows the storage and selective playback of multiple messages, and with additional control, the concatenation of words or short phrases to give different messages if desired. However, each message or message segment to be concatenated with another message segment must be in contiguous storage space, as the ISD 1016 cannot concatenate message segments in different memory space with a single starting signal. In addition, the external controller does not receive information from the ISD 1016 regarding the location of the row address pointer or the time when the end of the row would be reached.

Pending U.S. patent application Ser. No. 08/186,793, entitled "Message Management Methods and Apparatus" filed Jan. 25, 1994, and assigned to the assignee of the present invention discloses another messaging system in which message management is performed by referencing messages through the use of message numbers. In pending U.S. patent application Ser. No. 08/186,793, a register stack in each storage device keeps track of the message number associated with the message segment stored in the respective message segment location so that message segments associated with a particular message may be located in sequence for seamless playback of the entire message. Message segment storage locations available for storing new messages may be identified by a flag identifying the same, such as by an otherwise unused message number stored in the associated stack register. Each device includes the capability of cascading with identical devices so as to extend the total record and playback time available.

To facilitate the provision of essential information to an external microcontroller, a simple method and apparatus is desired to provide a flexible interface for management of the memory space in a manner transparent to those recording and those playing back the remaining messages. By providing this flexible interface, the actual memory mapping is now transferred to the microcontroller providing message address inputs so that efficient message management can be carried out. A simple but powerful instruction set is available for software control.

In the normal read, a memory cell in the memory array of a storage device is configured in a source follower mode, meaning its source and gate are at a fixed voltage, e.g. 3.5V, its drain is coupled to a current sink of a few microamps located in the column driver circuit, and its drain voltage is the memory cell output voltage.

In pending U.S. patent application Ser. No. 08/186,793, the voltage from the memory array is read out sequentially as follows. As the row signal is activated by the row decoder, the column decoding signal is also activated. The group of memory cells at the intersection of the selected row and columns are selected. The memory cells are thus configured in a source follower mode. The memory cells are connected to the current sinks in the column drivers through the column mux, and the resulting output voltages, i.e. the drain voltages of the memory cells, are serially provided to a difference amplifier. The output of the difference amplifier is provided to a smoothing filter and finally to a speaker amplifier. After one cell is read, the binary shifter enables the next cell. This process repeats until the last selected cell in the group is read. The column multiplexer then serially advances to the next column to select the next group of memory cells and the process is repeated. The read speed of this memory array is limited by how fast the voltage from the drain of a memory cell is available at the current sink of the column driver, the speed of the column decoder, the speed of the difference amplifier, the speed of the filter, and the speed of the speaker amplifier.

This is quite slow for production testing purposes, since the serial read and the normal signal path would consume too much time, which causes the die cost to be high.

To shorten this read timing in manufacturing, the present invention provides a high speed read scheme which also monitors the exact output voltage at a very high speed.

BRIEF SUMMARY OF THE INVENTION

The present invention discloses a device and techniques for message management using nonvolatile analog signal recording and playback. The device is an integrated circuit with interface circuitry for use as a peripheral device to a microcontroller or a microprocessor-based system. The serial interface allows the host microcontroller to perform a number of recording and playback control operations. The message management is designed to accommodate real-time events with provision for interrupt and status bits.

The present invention essentially includes an integrated circuit system and method for nonvolatile analog signal recording and playback having improved performance and a very high level of integration. The device is an integrated circuit with interface circuitry for use as a peripheral device to a microcontroller or a microprocessor-based system. The integrated circuit is complete with differential analog inputs, auto attenuation to improve signal quality, filter, fixed references including a band gap reference, trimming, memory array, multiple closed loop sample and hold circuits, column drivers, row decoder, address counters, master oscillator, chip function timing circuits, and a serial peripheral interface (SPI) and circuits on a single chip. The integrated circuit is interfaced with a host microcontroller through the SPI. The host microcontroller can send a number of commands to the integrated circuit through the SPI for efficient message management. These commands include the basic commands to record or playback and various addressing and message cueing options. The system utilizes redundancy to increase production yield. It also utilizes a high speed test mode to reduce production testing time.

DETAILED DESCRIPTION OF THE INVENTION

Figure 1:
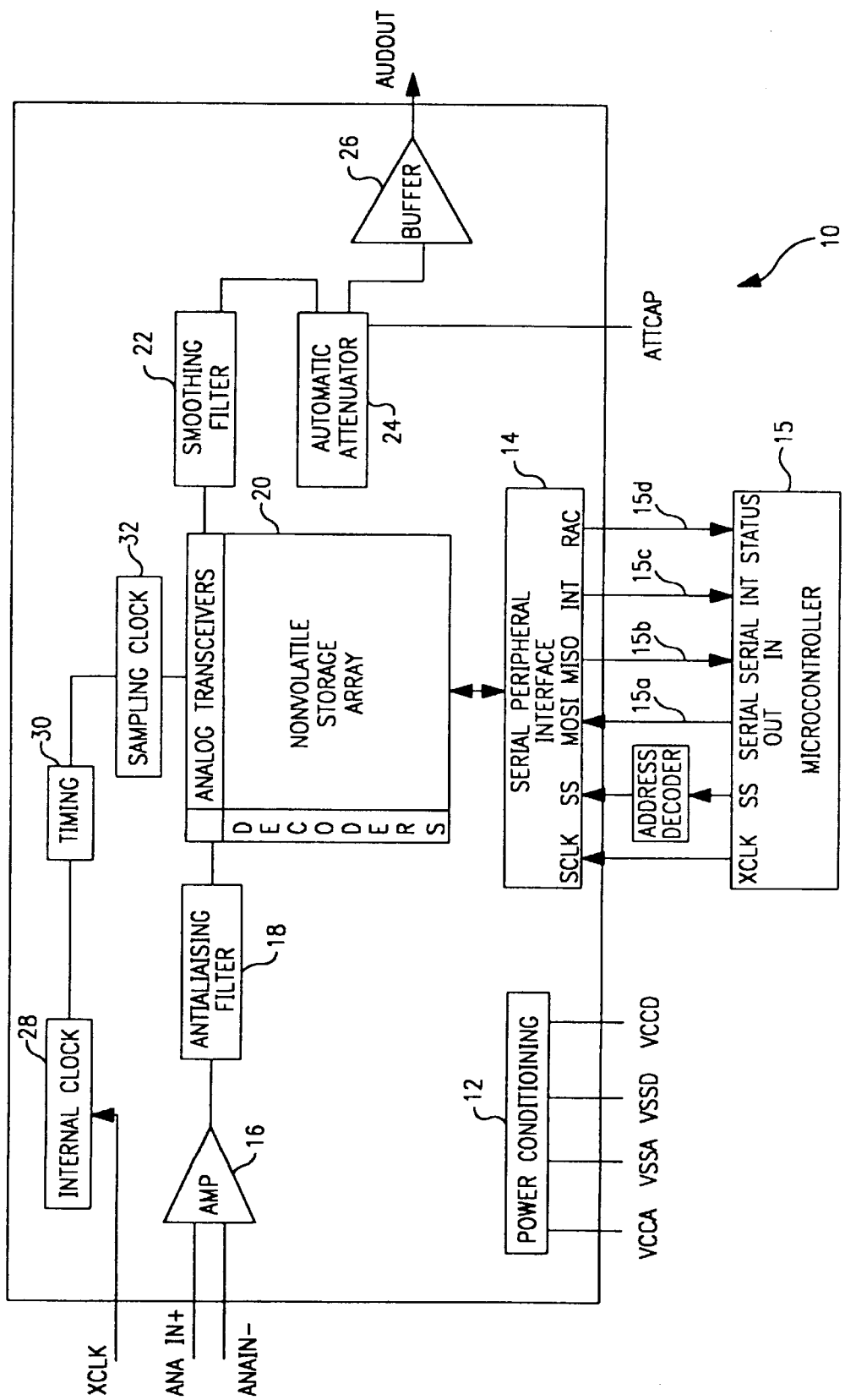
FIG. 1 is a block diagram of a preferred embodiment of the integrated circuit 10 in accordance with the teachings of the present invention.

Referring to FIG. 1, a block diagram of the preferred integrated circuit embodiment 10 of the present invention may be seen. The integrated circuit 10 shown integrates all major circuits of a message management system. The circuit 10 consists of four major sections—the analog input and output paths; the analog storage array; the serial peripheral interface and the automatic attenuator assembly. Power is supplied to the analog section and to the array and digital section from separate VCC and VSS supply pins. In that regard, care is taken to minimize noise coupling between the analog and digital sections, not only from the power supplies, but also from the other signals, by way of the block diagram level design, circuit design, physical layout and pin outs, and board level designs utilizing the device.

In particular, to minimize noise, the analog and digital circuits in the integrated circuit 10 of the present invention utilize separate power busses. The voltage inputs $V_{CCA}$ and $V_{CCD}$ which supply the analog and digital circuits respectively, are brought out to separate pins. In a preferred embodiment, the voltage inputs $V_{CCA}$ and $V_{CCD}$ are +3V. The ground inputs $V_{SSA}$ and $V_{SSD}$ to the analog and digital circuits respectively, are connected through a low-impedance path to power supply ground. The voltage inputs $V_{CCA}$ and $V_{CCD}$ and the ground inputs $V_{SSA}$ and $V_{SSD}$ are connected to a power conditioning circuit 12, which supplies regulated power to the circuits within the integrated circuit 10.

The Serial Peripheral Interface (SPI) 14 is provided for the control and addressing functions of the integrated circuit 10. The integrated circuit 10 is configured to operate as a peripheral slave device, with a microcontroller-based SPI 14 which interfaces to a microcontroller 15. Read/Write access to all the internal circuits of the integrated circuit 10 is provided through the SPI 14. An interrupt signal line (INT) and a status line (RAC) are provided for handshake purposes.

In particular, the SCLK, SS, MOSI and MISO pins on the SPI 14 are used for synchronous serial communications. The external microcontroller 15 uses these four pins to communicate and to check the status of the integrated circuit 10. The SCLK terminal is the clock input to the device. It is generated by the master device (microcontroller) and is used to synchronize Ad data transfers in and out of the device through the Master Out Slave In (MOSI) and Master In Slave Out (MISO) terminals, respectively. Data is latched into the integrated circuit 10 on the rising edge of SCLK and shifted out of the circuit 10 on the falling edge of SCLK. The SS input, when LOW, selects or activates the SPI 14. In this embodiment, the SPI 14 is selected when the slave select signal (SS) received at the SS terminal, is LOW. Alternatively, the SPI 14 may be permanently selected by tying the SS pin to a ground voltage. The MOSI pin is a serial input to the SPI 14. The master device (microcontroller 15) places data on the MOSI line one-half cycle before the SCLK clock edge. The MISO terminal is the serial output of the integrated circuit 10. This output goes into a high-impedance state if the integrated circuit 10 is not selected.

The INT pin is an open-drain output pin which is activated (drops low to "0") when the system reaches an end of message (EOM) marker in play or when the memory array is full. Each operation that ends in an EOM or Overflow will generate an interrupt which indicates the end of a Record, Playback, or Message Cueing cycle. The interrupt will be cleared the next time an SPI cycle is initiated.

The RAC (Row Address Clock) terminal is an open drain output pin that provides a signal with a 150 ms period at 8 KHz sampling frequency. This represents a single row of memory, and there are 800 rows of memory in the device 10. The signal remains HIGH for 137.5 ms and stays LOW for 12.5 ms when it reaches the end of a row. This pin may be used for implementation of message management techniques.

Figure 2A:
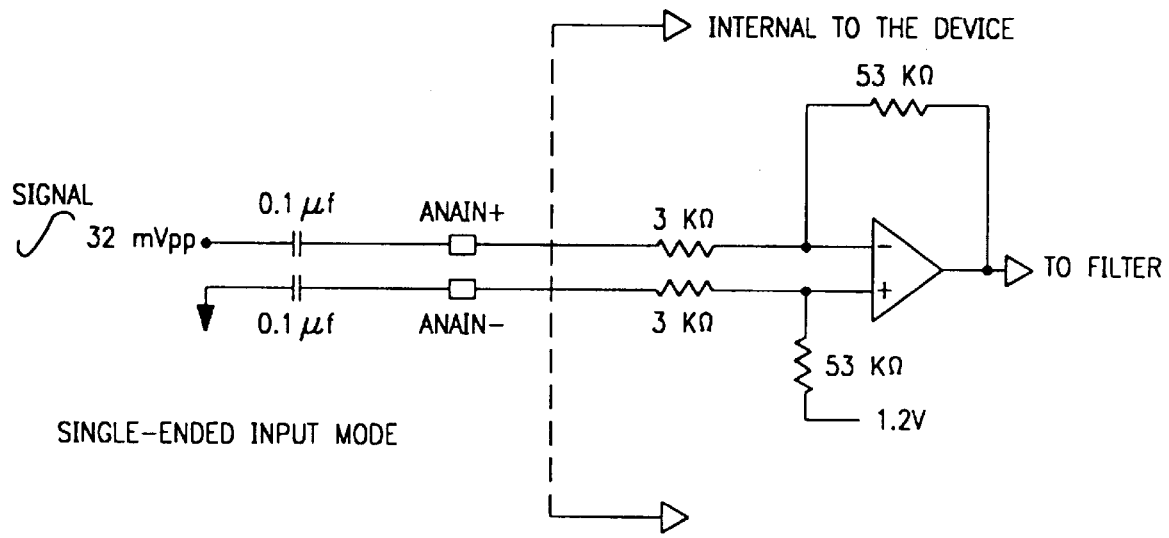
FIG. 2A illustrates a circuit connection to the ANA IN+ input of FIG. 1 for recording in a single-ended input mode.

Speech signals are provided to the integrated circuit 10 via the ANA IN+ pin for recording. This pin is the non-inverting analog input for the device. The analog input amplifier 16 can be driven single-endedly or differentially. In the single-ended input mode, a 32 $mV_{p-p}$ maximum signal is capacitively connected to the ANA IN+ pin, as shown in FIG. 2A. The capacitor value of 0.1 $\mu F$, together with the 3

Kohm input impedance of the ANA IN+ pin, is selected to provide cutoff at the low frequency end of the voice passband. In the differential input mode, the maximum input signal at the ANA IN+ pin should be 16 $mV_{p-p}$.

Figure 2B:
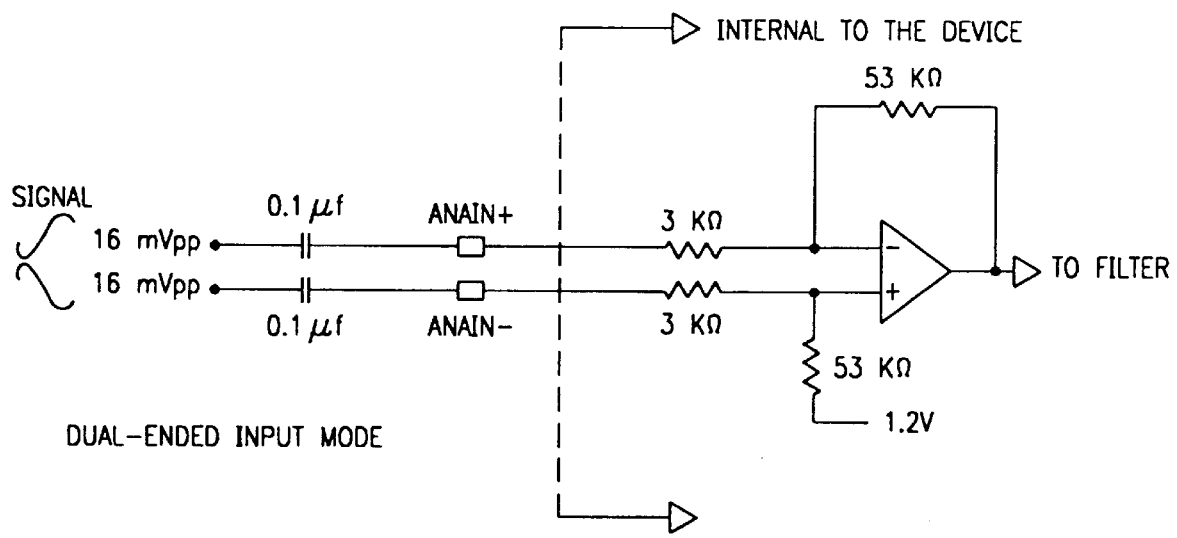
FIG. 2B illustrates a circuit connection to the ANA IN− input of FIG. 1 for recording in a differential input mode.

The ANA IN− pin is the inverting analog input terminal that transfers the signal to be recorded to the amplifier 16 in the differential-input mode. In this differential-input mode, a 16 $mV_{p-p}$ maximum input signal may be capacitively coupled to the ANA IN− pin, as shown in FIG. 2B. The coupling capacitor is preferably equal to the coupling capacitor used on the ANA IN+ pin. The input impedance at ANA IN− is nominally 56 Kohms. In the single-ended mode, ANA IN− should be capacitively coupled to $V_{SSA}$ through a capacitor equal to that used on the ANA IN+ input.

The output of the amplifier 16 is provided to an anti-aliasing filter 18, the function of which is to limit the upper frequency of the audio (or other analog) signal so that the signal frequency range does not violate the sampling theorem for the analog signal sampling. The filtered signal is stored in a nonvolatile analog storage array 20. In a preferred embodiment, the storage array 20 is that disclosed in U.S. Pat. No. 5,241,494 entitled "Integrated Circuit System For Analog signal Recording And Playback" which is incorporated herein by reference. When the stored signal is retrieved, it is first provided to a smoothing filter 22 and then to an automatic attenuator 24. The automatic attenuator 24 may be located before the filter 22 without affecting the circuit operation.

The automatic attenuator 24 is controlled by the pin ATTCAP. The automatic attenuator 24 attenuates the signal when the signal drops below an internally set threshold. This helps in eliminating output noise when there is no signal. The output of the automatic attenuator is buffered by buffer 26. Buffer 26 is a typical analog MOS buffer. The output of the buffer 26 is AUDOUT.

Timing for the integrated circuit 10 is provided either by an external clock via the External Clock (XCLK) terminal or by an internal oscillator. Either clock signal provides timing reference for the timing circuit 30, which in turn provides timing control for the sampling clock 32 connected to the nonvolatile analog storage array 20.

Redundancy for the integrated circuit 10 may also be provided as described in U.S. patent application Ser. No. 08/653,073, entitled "Method and Apparatus of Redundancy for Non-Volatile Memory Integrated Circuits" which is assigned to the assignee of the present invention and incorporated herein by reference.

One aspect of the present invention includes a high speed read scheme which provides monitoring of the exact output voltage of a memory array at a very high speed. Instead of reading cell by cell serially by multiplexing the shift registers, a group of cells, for example 100 cells, are read in parallel in the source follower mode, the resulting analog output voltages are then compared to a fixed input reference voltage, the comparator digital outputs are then latched into the latches at the same time. A fast serial shift is executed to shift out all the logic signals, instead of analog signals, into a digital output pad, bypassing the output analog path. The speed is limited by the shift register and the output digital pad for every 100 cells. By reusing existing circuits, no additional penalty in diesize is encountered.

This aspect of the present invention may be implemented in the storage array 20. In a preferred embodiment, the storage array 20 is that disclosed in U.S. patent application Ser. No. 5,241,494 entitled "Integrated Circuit System for Analog Signal Recording and Playback" which is incorporated herein by reference. In one embodiment, the memory array has 960K cells, which are organized into 800 rows by 1200 columns. A 12:1 mux is used to multiplex 12 columns to one column driver. Hence the total number of column drivers is 1200/12=100 column drivers.

In the normal reading, a shift register, which is part of the column driver, is used as a cyclic binary shifter to enable the provision of one memory output at a time, along the column drivers, beginning from the first column to the 100th column. At the end of the 100th cell (or column), the column mux goes to the next 100 columns, and the process repeats 12 times to cover the whole row. After the end of one row, the row clock advances to the next row, and the column mux is reset to enable the first 100 columns. The process then repeats for the next row. The memory output is the actual voltage level coming from the memory cell, and is not necessarily a logical one or zero.

Figure 3A:
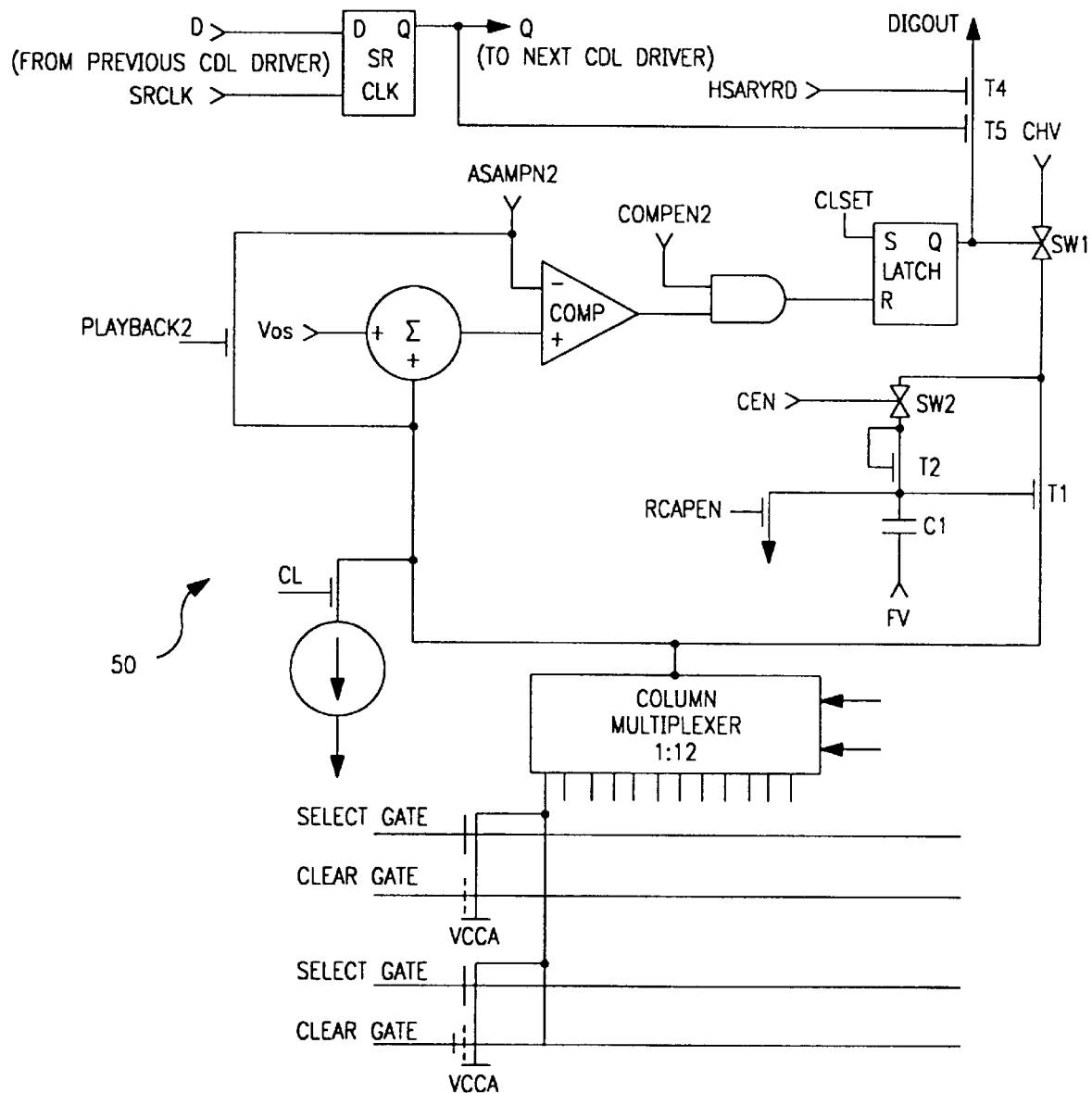
FIG. 3A illustrates one embodiment of the column driver implemented in the memory array 20 of FIG. 1.
Figure 3B:
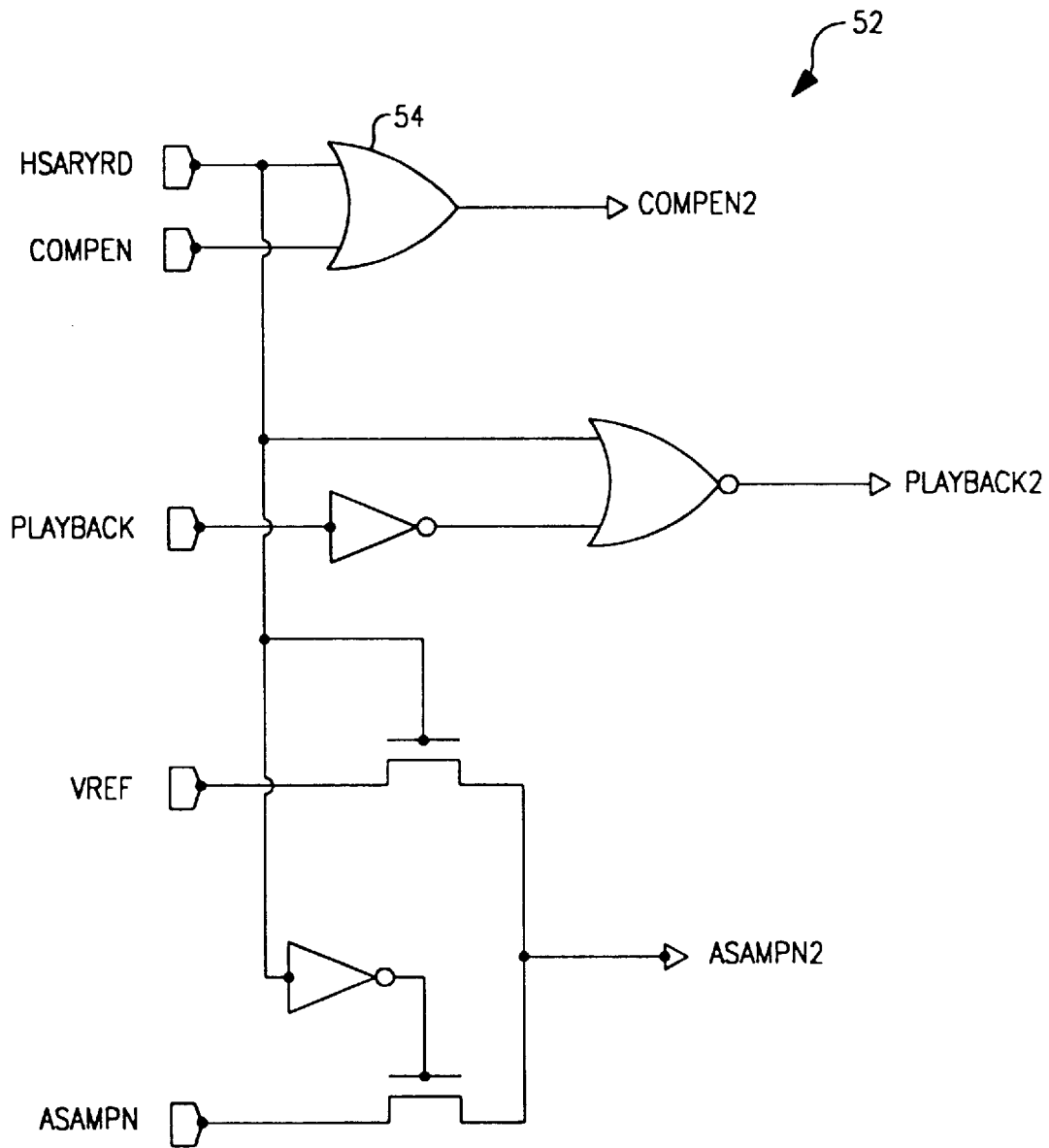
FIG. 3B illustrates the high speed control logic circuit used in controlling the column driver of FIG. 3A.

FIG. 3A illustrates a column driver 50 that may be implemented in the storage array 20. FIG. 3B illustrates a high speed control logic circuit 52 which controls the column driver 50 of FIG. 3A. With reference to FIG. 3B, in the high speed read mode, the HSARYRD signal is high, which causes COMPEN2 to be high. The activation of the COMPEN2 signal enables the comparator COMP (see FIG. 3A) that is used in the writing period now to be used in the high speed read. The comparator COMP is used in the writing period to ensure the desired memory output voltage is the same as the input voltage. In the high speed read, the comparator COMP acts to compare whether the output is above or under a reference voltage, VREF (see FIG. 3B), which is input from an input pad under a testmode enable signal. By varying VREF until the memory output switches state, the exact output voltage is obtained. The output of the comparator COMP is a logical one or zero and is latched in the same latch that is used to control the high voltage HV switching in the write period. The HSARYRD signal also disables the PLAYBACK2 signal, allowing the memory output to go to the positive terminal of the comparator COMP and the VREF to go to the negative terminal of the comparator COMP.

The HSARYRD signal enables all the 100 comparators to be active at once, and all 100 outputs are each latched into a respective one of 100 latches LATCH. The shift register SR used to control the column mux timing is now used to serially shift out the 100 data samples just latched in by the 100 latches. In particular, the output of the shift register SR together with the HSARYRD signal, provide the 100 data samples as outputs at output terminal DIGOUT via transistors T5 and T4 respectively. The clocking of the shift register SR is derived from an oscillator on the integrated circuit 10. The output at output terminal DIGOUT is then multiplexed to a digital output through the HSARYD signal. The process repeats 12 times to cover the whole row. Thus for one row, there are 12 slow sensing times as compared to 1200 slow sensing times as in a regular read. The other times are quick serial shifting, which are very fast.

Figure 4A:
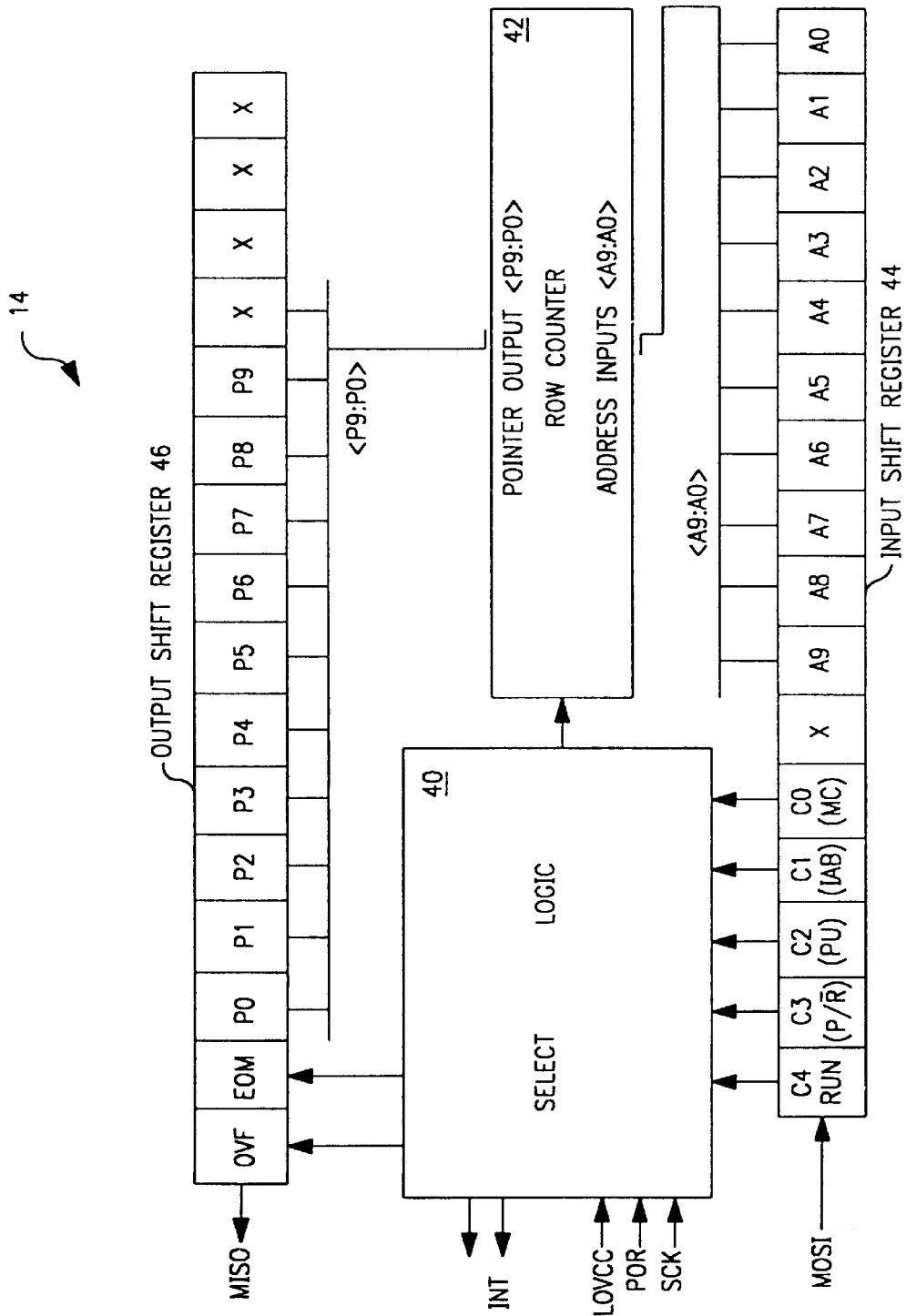
FIG. 4A is a detailed block diagram of the serial peripheral interface (SPI) 14 of FIG. 1, which is fully compatible with the SPI standard.
Figure 4B:
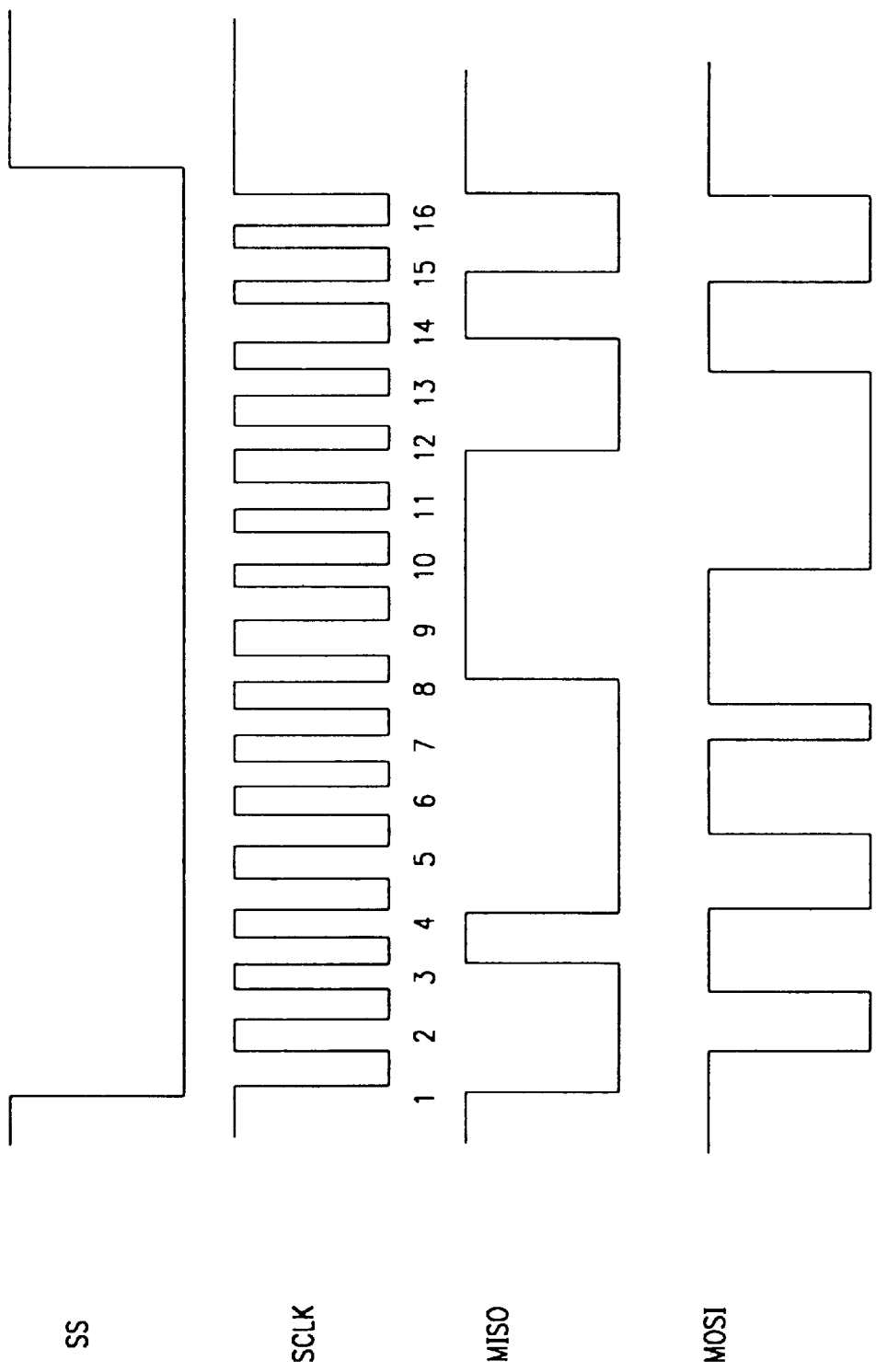
FIG. 4B is a timing diagram illustrating the timing cycles of various signals received or generated by the Serial Peripheral Interface (SPI) 14 of FIG. 1.

FIG. 4A is a detailed block diagram of the SPI 14. The SPI includes select logic 40, a row counter 42, an input shift register 44 and an output shift register 46. All serial data transfers begin with the falling edge of the signal on the SS pin. The SS signal is held LOW during all serial communications and held HIGH between instructions. FIG. 4B illustrates one example of the timing cycles of the signals provided to the SPI 14. In this example, the SS input is held LOW for 16 serial clock (SCLK) periods. During this time, the MISO data is serially read out from the device and the MOSI data is serially written into the device.

The input shift register 44 is coupled to the MOSI pin and receives serial inputs from the master device such as the microcontroller 15 (see FIG. 1). The microcontroller 15 may be any microprocessor including a general-purpose microprocessor, an embedded controller, a single-chip microcontroller, or a complete microprocessor system. The input shift register 44 includes bits A9-AO, X and C4-CO. Bits A9-AO hold the new address of the Row counter 42, X is not used and C4-CO are control bits. In one embodiment, the control bits are used to control the following functions: CO is used for message cueing (MC); C1 is the Ignore Address control Bit (IAB); C2 is the power up control bit (PU); C3 is the play/record control bit (P/R̄) and C4 is the RUN control bit (RUN). These device functions are controlled as shown in Table 1.

TABLE 1

| Instruction | Control bits C4–C0 | Operational Summary |
|---|---|---|
| RUN | | Enable or Disable an operation |
| = | 1 | Start |
| = | 0 | Stop |
| P/R̄ | | Selects Play or Record Operation |
| = | 1 | Play |
| = | 0 | Record |
| PU | | Master power control |
| = | 1 | Power-Up |
| = | 0 | Power-Down |
| IAB | | Ignore address control bit |
| = | 1 | Ignore input address register (A9–A0) |
| = | 0 | Use the input address register contents for an operation (A9–A0) |
| MC | | Message Cueing |
| = | 1 | Enable message cueing |
| = | 0 | Disable message cueing |
| P9–P0 | | Output of the row pointer register |
| A9–A0 | | Input address register |

When IAB is set to 0, Playback or Record operation starts from address (A9–A0) and ends at the end of that row. For consecutive playback or record, set IAB = 1 immediately after sending the command with IAB = 0.

Message cueing is started at a specified address with the IAB bit set or at the current address without the IAB bit set. When the message cueing bit CO is set, the user can skip through messages without knowing the actual physical location of the messages. This operation is used during playback. In this mode, the messages are skipped many times faster than in normal playback mode. In a preferred embodiment, the messages are skipped 800 times faster than in normal playback mode. Playback terminates when an EOM marker is reached. Then, the internal address counter will point to the next message. A summary of the instructions sent by the microcontroller 15 to the SPI 14, along with the corresponding operations, is provided in Table 2.

TABLE 2

| Instruction | Control bits C4–C0 | Operational Summary |
|---|---|---|
| POWER UP | 00100 | Power Up. Device Will be ready for an operation after time out period. |
| SETREC | 10100 | Initiate recording. Must be followed by REC command. Record after time out period starting at the address A9–A0. |
| STOPPWRDN | 0x01x | Stop an operation and Power Down. |
| STOP | 0x110 | Stop Record or Playback operation. |
| SETPLAY | 11100 | Playback at an address after Power Up. Initiate playing. Must be followed by PLAY command. |

TABLE 2-continued

| Instruction | Control bits C4–C0 | Operational Summary |
|---|---|---|
| REC | 10110 | Start Record at the next available address. |
| SETMC | 11101 | Initiate Playback and Message Cueing (MC) at the address specified by A9–A0. Must be followed by MC command. |
| MC⊕ | 11111 | Initiate a Playback and Message Cueing at the next available address. |
| PLAY | 11110 | Play at the next available address (ignore address bits). |
| RINT* | 0x110 | Read Interrupt status bits: Overflow and EOM. |

*As the Interrupt data is shifted out of the integrated circuit 10, control and address data is being shifted in. The interrupt command should be compatible to the current command if there is no change to the device operation.
⊕Message cueing can be selected only at the beginning of play operation.

With reference to FIG. 4A, the control bits C4-CO are provided from the input shift register 14 to the select logic 40. Upon latching the control data from the input shift register 44, the select logic 40 generates control signals that are distributed internally to various other system blocks and also to control the power-down, record/play select, message cueing mode and the IAB. The select logic 40 receives additional inputs from internal signals such as low Vcc detect (LOVCC) and Power on Reset (POR).

An internally generated clock signal is used to synchronize these inputs and to prevent the control circuit from entering a metastable state which locks up the integrated circuit 10. In one embodiment, a power-up time of 25 ms is provided to allow all the bias generators and capacitors to reach their quiescent point. The row counter 42 receives address inputs A9-AO from the input shift register 44 and provides these as pointer outputs to output shift register 46.

The interrupt signal (INT) and the status bits (End-of-Message (EOM) and Overflow (OVF)) are generated by the select logic 40. The interrupt signal is cleared after the status has been read by the microcontroller 15. The internal operation of the integrated circuit 10 does not depend on the time at which the interrupt was cleared. By way of example, when the integrated circuit 10 is in the play mode and encounters an EOM marker, the integrated circuit 10 stops playing and generates an interrupt. Similarly, when the integrated circuit 10 is in overflow, which indicates that a Record, Playback or Message Cueing cycle has reached the end of the last row in the circuit 10 memory, the circuit 10 generates an interrupt and stops the operation.

In implementing the flexible message management system of the present invention, three criteria must be met. First, a scheme for reading the address of the row pointer must be provided. Second a flag for detecting the end of the current row must also be provided. Third, the ability to load a new address (from the address register at the end of the current row, instead of incrementing the row pointer to the subsequent row), must be provided.

To accomplish these, first, the status bits EOM and OVF and the row pointers P9-PO are shifted out from the output shift register 46 to the master device via the MISO pin during an SPI transfer. Second, the RAC signal is provided for the early detection of an end of the current row. As an example, for an 8 KHz sample rate, the maximum duration of a message in one row is 150 ms. The RAC signal stays high (output held high by an external pull-up resistor) for 137.5 ms and changes to a low state for 12.5 ms. This waveform is periodic, and it tracks the sample rate of the internal 512 KHz oscillator and continues as long as the system 10 is recording or playing. Thirdly, the IAB bit is provided in the control register 44 to control the manner in which the row address counter is loaded. If the IAB bit is set ("1"), the row address increments to the following row at the end of the current row. If the IAB bit is reset ("0"), a new address is loaded into the row address counter. This new address is the content of bits A9-A0 of the SPI input shift register 44. The select logic 40 generates the appropriate control signals based on the value of the IAB bit.

An example of the interaction between the integrated circuit 10 and the microcontroller 15 will now be described. With reference to FIG. 1, the microcontroller 15 communicates with the integrated circuit 10 via serial lines 15a and 15b. In particular, the microcontroller 15 issues commands and provides row address via line 15a. The microcontroller 15 also monitors the status of the memory located in the integrated circuit 10 and reads the serial inputs from the integrated circuit 10 via signal line 15b.

Figure 5A:
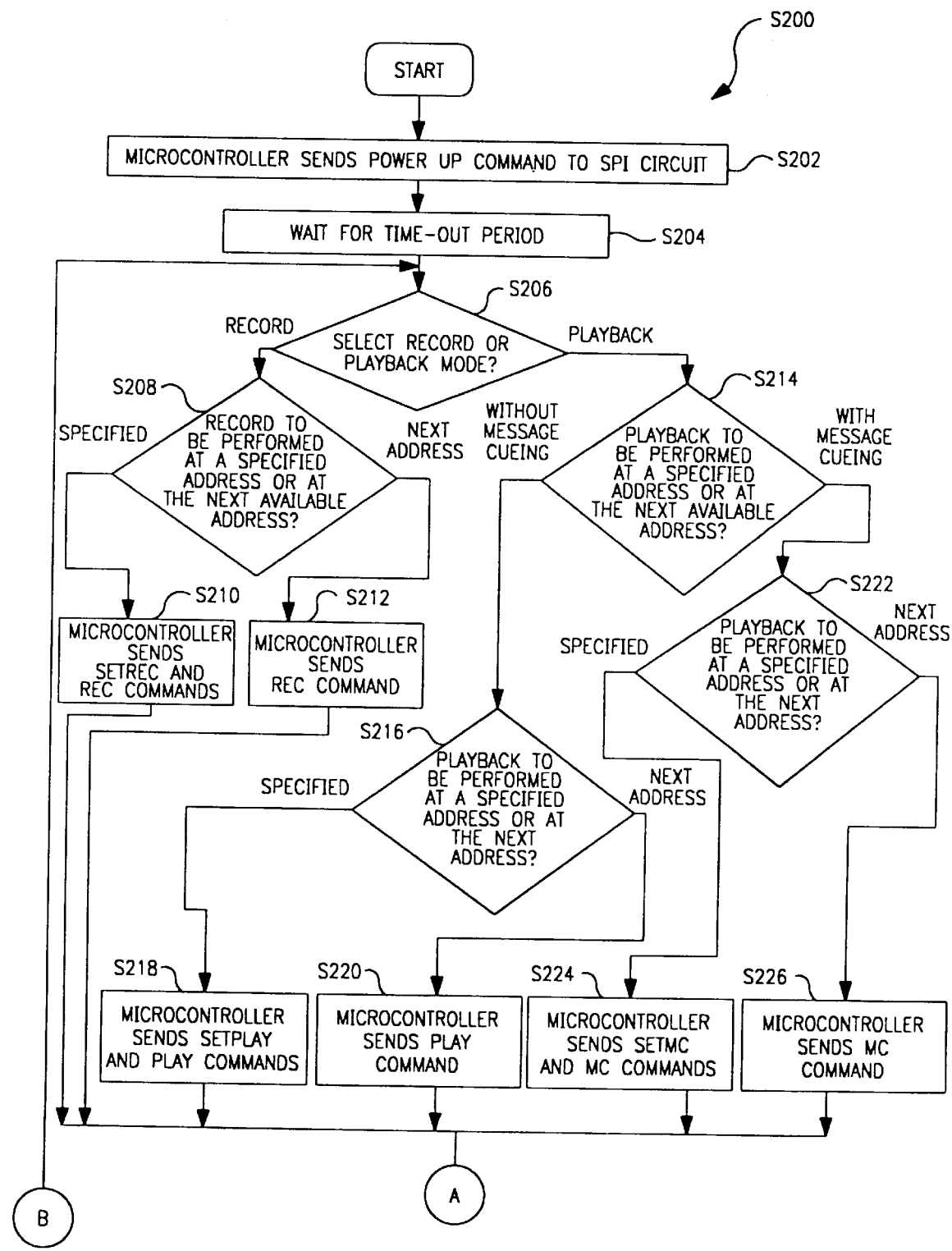
FIGS. 5A and 5B are a flowchart illustrating the process of issuing commands in accordance with one aspect of the present invention.
Figure 5B:
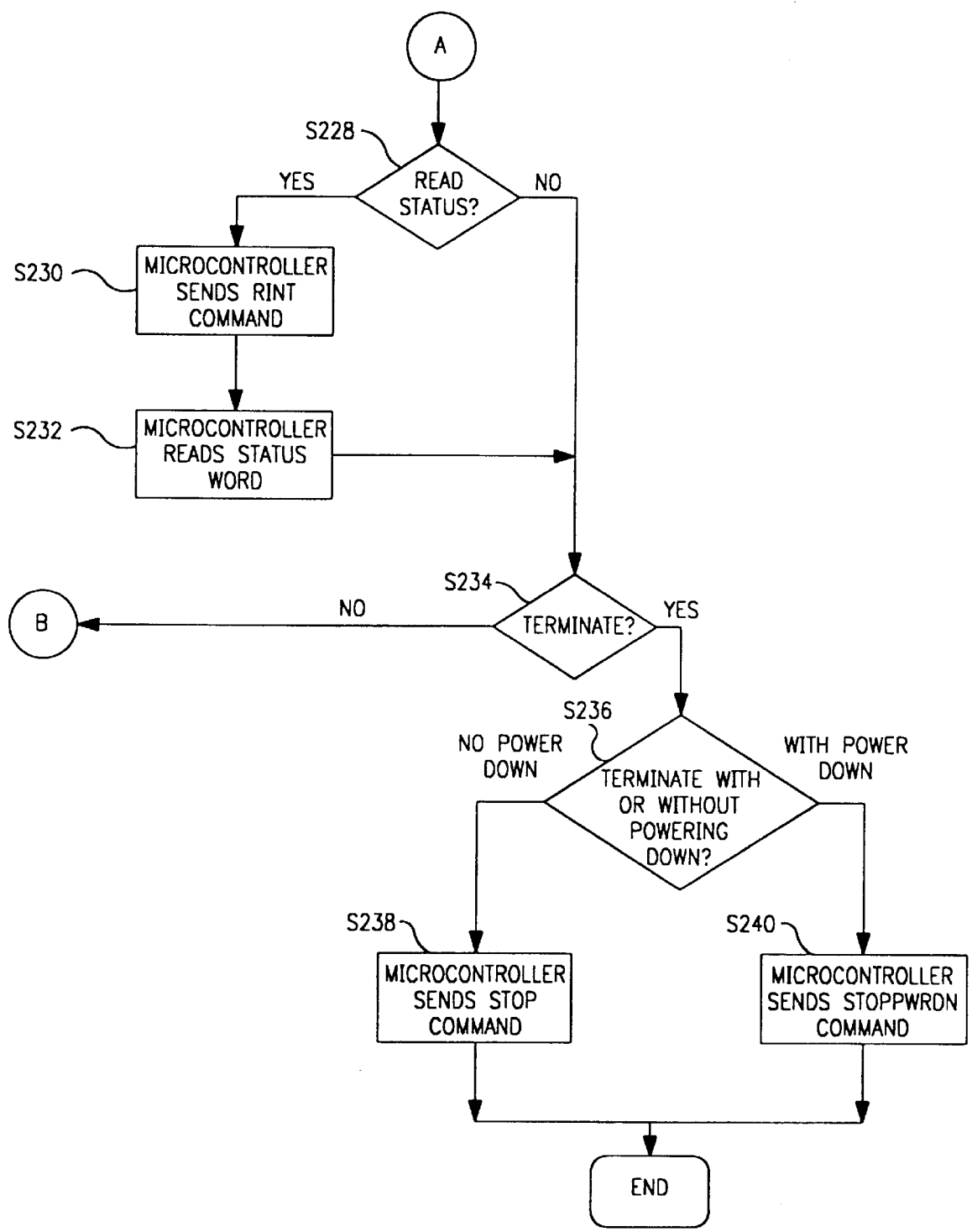

FIGS. 5A and 5B is a flowchart illustrating the process S200 of issuing commands from the microcontroller 15 to the integrated circuit 10. The process S200 begins from a start state and proceeds to step S202, where the microcontroller 15 sends the command POWER UP to prepare the integrated circuit 10 for receiving an operational command. At step 204, the microcontroller 15 waits for the device time-out period, which in the preferred embodiment is approximately 25 msec. The process S200 then proceeds to decision step S206, where it queries whether the recording or the playback mode is selected.

If the recording mode is selected, the process further queries, at decision step S208, whether the recording is to be performed at a specified address or at the next available address. If recording at a specified address is desired, the microcontroller 15 sends the SETREC and REC commands to the integrated circuit 10, as shown in process step S210. Table 2 illustrates the corresponding control bits sent by the microcontroller 15 to the SPI 14 which represent this and other commands. The specified address will be attached as part of the command word. If the recording at the next available address is desired, the microcontroller 15 sends a REC command (see Table 2), which initiates recording at the next available address, as shown in process step S212.

If, at decision step S206, it is determined that the playback mode is to be selected, the process S200 proceeds to decision step S214 where it queries whether the playback is with or without message cueing. Message cueing allows the user to skip through messages, without knowing the actual physical location of the message. The skipping takes place at a much faster rate than in normal playback mode. If "message cueing" is not desired, the process S200 proceeds to process step S216, where it queries if playback without message cueing is to be performed at a specific address or at the next available address. If the former is desired, the process S200 proceeds to process step S218, where the microcontroller 15 sends the SETPLAY and PLAY commands (see Table 2) along with the specified address. If playback at the next available address is desired, the microcontroller 15 sends the PLAY (see Table 2) command.

Similarly, if "with message cueing" is desired when queried at decision step S214, the process S200 proceeds to process step S222 to query if playback at a specified address or playback at the next available address is desired. If, playback at a specified address is desired, the process S200 proceeds to process step S224, where the microcontroller 15 sends the SETMC and MC commands (see Table 2) along with the specified address. If playback with message cueing is desired at the next available address, the process S200 proceeds to process step S226, where the microcontroller 15 sends the MC command (see Table 2) to the circuit 10.

Upon executing any one of the process steps S210, S212, S218, S220, S224 or S226, the process S200 proceeds to decision step S228, where it queries if the status bits of integrated circuit 10 such as End-of-Message (EOM) or Overflow (OVF) should be read. If so, the process S200 proceeds to process step S230, where the microcontroller 15 sends the RINT command (see Table 2). The status bits and address bits are then shifted out serially via line 15 (see FIG. 1) to the microcontroller 15, as shown in process step S232. The process S200 then advances to decision step S234. If, at decision step S228, it is determined that the status bits should not be read, the process S200 proceeds directly to decision step S234.

At decision step S234, the process S200 queries if it should terminate. If the microcontroller 15 issues a command to continue, control branches back to decision step S206 for the next operation. If the microcontroller 15 issues a command to terminate, the process S200 proceeds to decision step S236, where it queries if the process S200 should be terminated along with or without the powering down of the integrated circuit 10. If termination without powering down is desired, the microcontroller 15 sends the STOP command (see Table 2), as shown in process step S238. The process S200 then terminates, without powering down of the integrated circuit 10. If termination along with the powering down of the integrated circuit 10 is desired, the microcontroller 15 sends the STOPPWRDN command (see Table 2). The process S200 then terminates, along with the powering down of the integrated circuit 10.

Although the flowchart in FIGS. 5A and 5B is shown with sequential steps and decision boxes to illustrate the decision logic, it is understood that the microcontroller 15 can send the above commands in any order.

Figure 6:
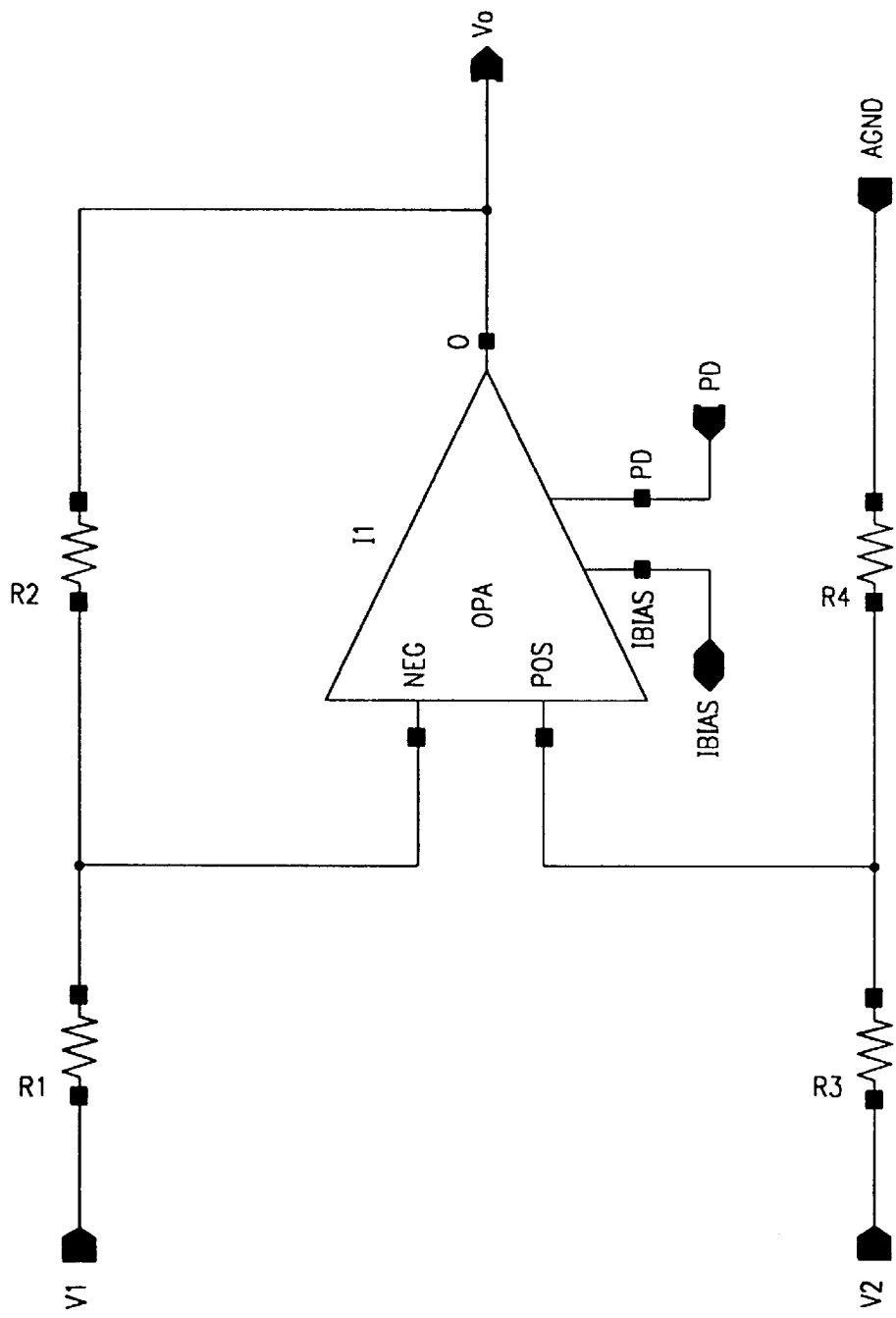
FIG. 6 is a detailed circuit diagram illustrating the fixed gain amplifier 16 of FIG. 1.

FIG. 6 is a detailed schematic diagram of the fixed gain amplifier 16 of FIG. 1. The equation for the amplifier 16 output Vo may be expressed as follows:

$$Vo = -(R2/R1)*(V1-V2) + AGND \qquad \text{Eqn. (1)}$$

where R1=R3 and R2=R4.

Therefore, the signal gain magnitude is given by R2/R1 while any noise on the analog grounds is not amplified. If (R2/R1)=53K/3K then the signal gain is roughly 25 dB while any noise on the analog ground resumes at 0 dB. Equation 1 also indicates how the circuit can reject noise associated with the signal ground. If V2 is AC-coupled to the signal ground, then since V1 has the same ground component the noise components will subtract. Single ended or differential signals can be applied to the circuit. However, it should be noted that the peak to peak levels in the differential mode should be half that used for the single ended mode to obtain the same peak output level Vo.

Figure 7:
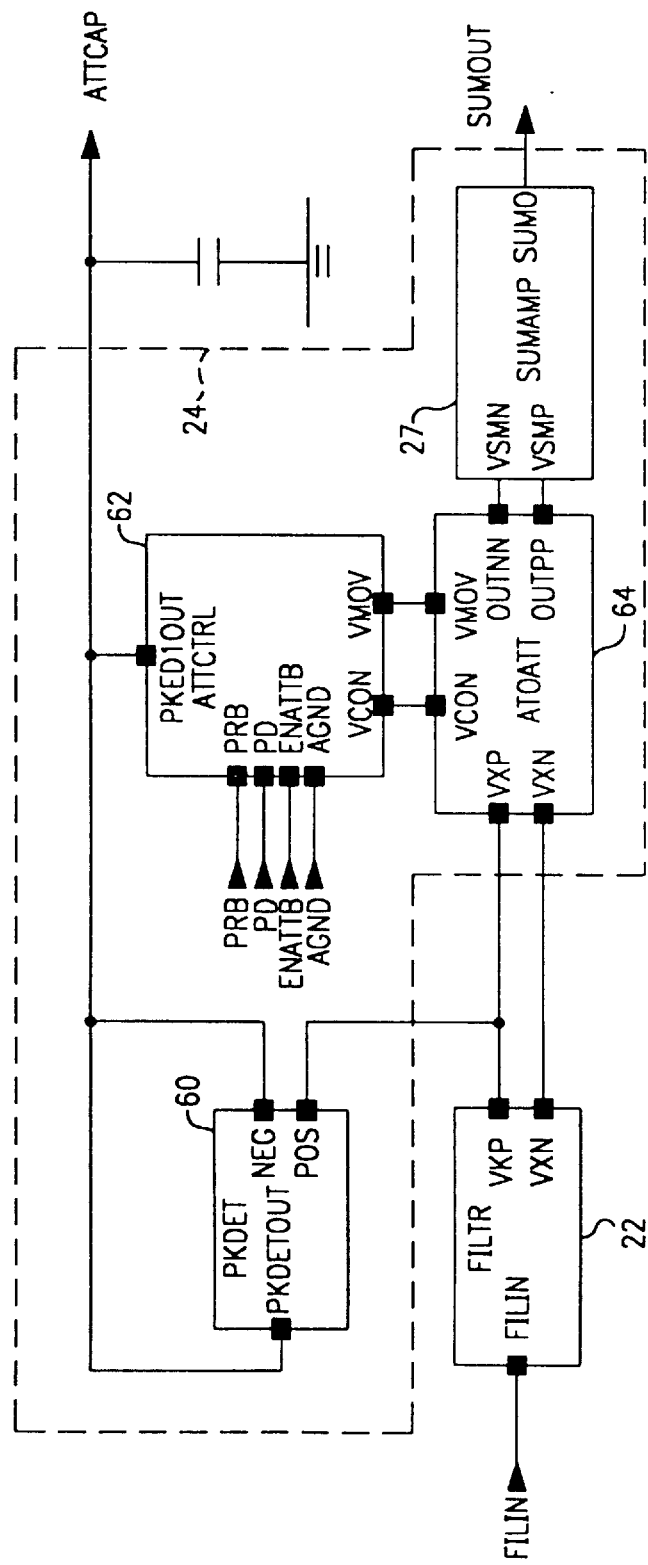
FIG. 7 is a detailed circuit diagram illustrating the filter 22 and the attenuator assembly 24 as shown in FIG. 1.

FIG. 7 illustrates a detailed block diagram of the filter 22 and the automatic attenuator assembly 24 of FIG. 1. The automatic attenuator assembly 24 attenuates noise during "silence" periods when the chip is in the play mode. There are three main blocks that make up the automatic attenuator assembly 24, namely the peak detector (PKDET) 60, the attenuator control circuit (ATTCTRL) 62, and the attenuator (ATOATT) 64. The peak detector 60 senses the signal peak level at the output of the filter 22 and if the signal peak level is below a certain threshold, the ATTCTRL 62 determines that attenuation should occur. It then adjusts the VMOV signal appropriately to cause attenuation to occur. The attenuator ATOATT 64 is driven differentially by the filter 22 and the ATOATT 64 further drives the summing amplifier 27 to perform a differential to single ended conversion. In one embodiment, the filter 22 is a Chebychev filter and the amplifier 27 is a typical summing amplifier.

Figure 8:
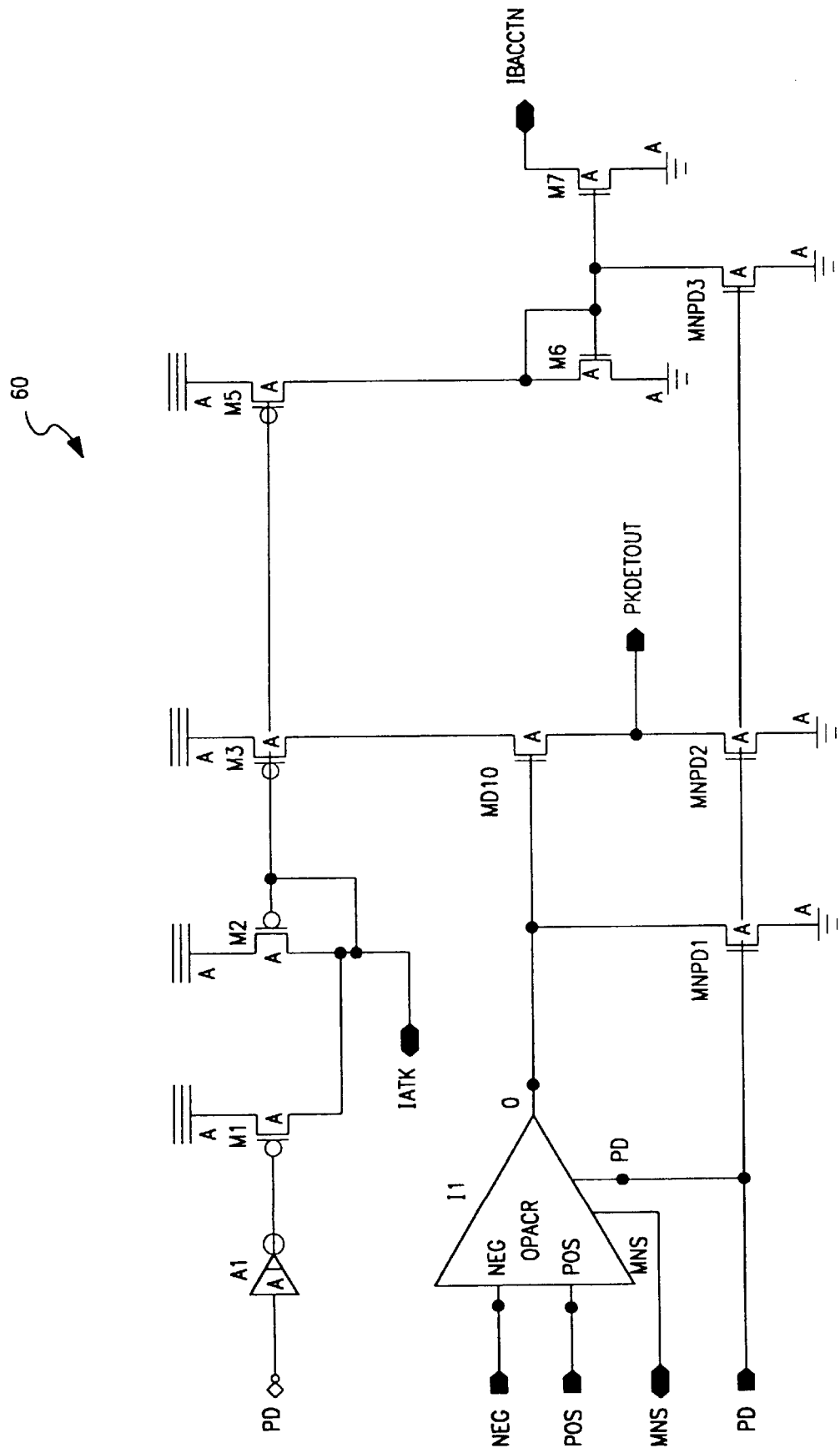
FIG. 8 is a detailed circuit diagram illustrating the peak detector 60 of FIG. 7.

FIG. 8 is a detailed circuit diagram of the peak detector 60 of FIG. 7. During powerdown, the signal PD will be high, turning on n-channel devices MNPD1, MNPD2 and MNPD3 and powering down the differential amplifier OPACR. Device MNPD1 pulls the gate of n-channel device MD10 low, turning the same off so that n-channel device MNPD2 can pull the output of the peak detector PKDETOUT low. Also, with PD high, the output of inverter A1 turns on p-channel device M1, which pulls the drain of p-channel device M2 high, as well as the gates of p-channel devices M2, M3 and M5, turning the same off. Device MNPD3 being turned on pulls the gates of n-channel devices M6 and M7 low, turning the same off.

In normal operation with the power down signal PD low (not powered down), p-channel device M1 is off, as are n-channel devices MNPD1, MNPD2 and MNPD3. In this state, the amplifier OPACR is appropriately biased by a bias current IBIAS, with the current in current sources M2, M3 and M5 being set by the bias current IATK. Amplifier OPACR, operating as a comparator as a result of the feedback of the peak detector output PKDETOUT to the negative input of the peak detector 60 as shown in FIG. 7, provides a high output whenever the positive input to OPACR exceeds the peak detector output, turning on n-channel device MD10 to couple the current from current source M3 to charge the peak detector output node PKDETOUT, which as shown in FIG. 7 will be connected to an external 1 micro farad capacitor connected thereto.

In normal operation, the bias current IATK is derived from a zero temperature coefficient current source whose absolute value is also trimmed at wafer sort. The current source M3 controls the attack time and maintains a constant charging current into the external 1 micro farad capacitor connected to the peak detector output. The zero temperature coefficient current is also mirrored by device M5 to devices M6 and M7. The current source M7 is divided down in the ATTCTRL block 62 (FIG. 7) and the resultant current sink is used to discharge the external 1 micro farad capacitor. The charging time of the 1 micro farad capacitor sets the attack time, while the discharge time defines the release time. The attack time is the time required for the automatic attenuator to return to its zero dB gain state when the signal moves rapidly out of a silence condition. The release time is the time for the automatic attenuator gain to go from zero dB to −6 dB after the signal has entered a silence period. The release time is usually made much longer than the attack time to assure that the system is in a true silence period before the −6 dB gain level is enabled. The attack time, on the other hand, is normally desired to be relatively short, as the return to the zero dB gain state should be rapid to avoid truncating the first word or other sound after a silence period.

Figure 9:
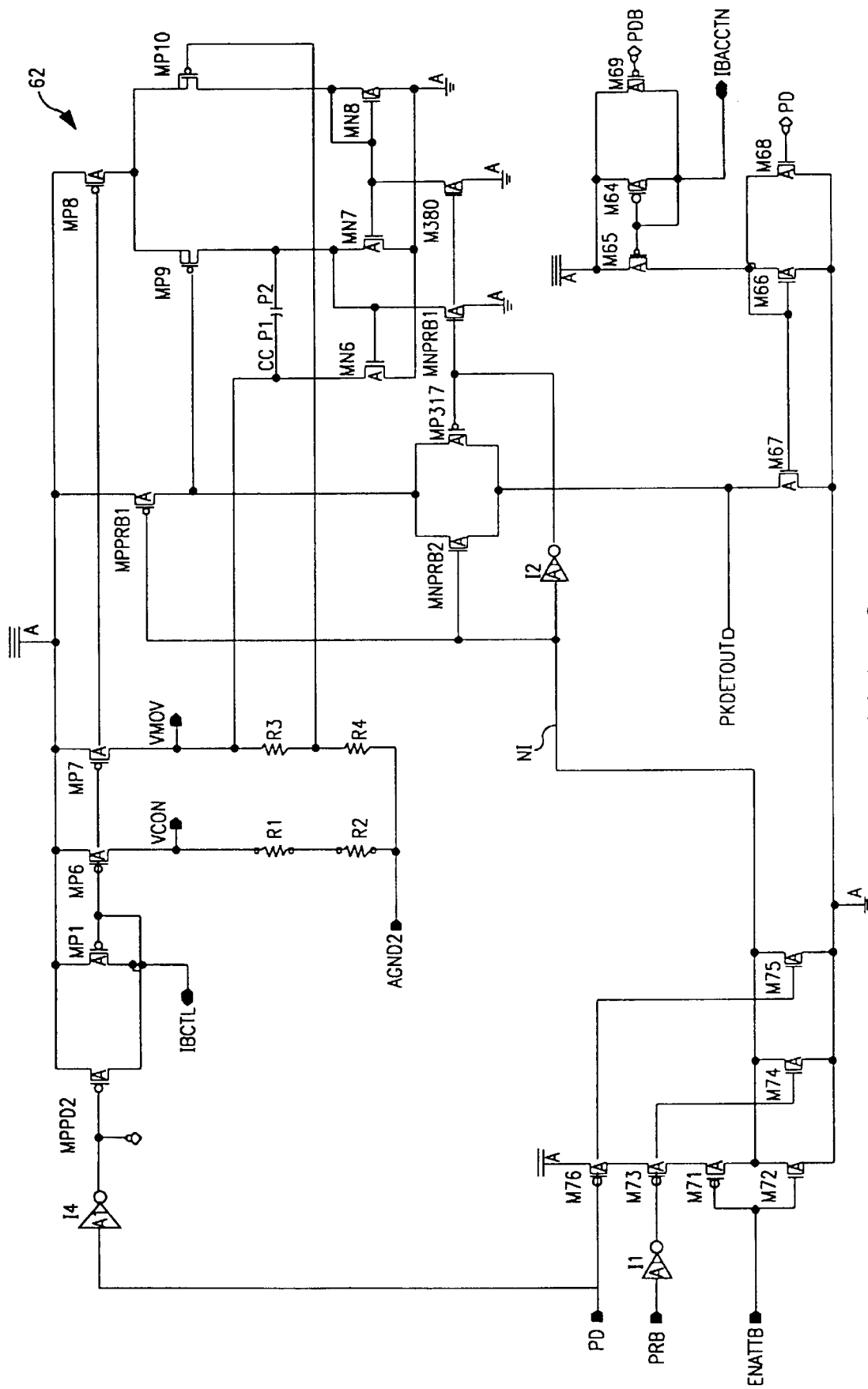
FIG. 9 is a detailed circuit diagram of the attenuator control circuit 62 of FIG. 7.

FIG. 9 illustrates a detailed circuit diagram of the attenuator control circuit 62. The attenuator control circuit 62 generates two control voltages VCON and VMOV based on the peak detector 60 output PKDETOUT. The NOR gate formed by p-channel devices M71, M73 and M76, n-channel devices M72, M74 and M75 and inverter I1 controls whether or not the attenuation is enabled. Attenuation is disabled if the chip is powered down (PD high), if the part is in record mode (PRB or Play/Record low) or if the trim bit output ENATTB is high.

The circuit in the bottom right hand section of FIG. 9 comprising p-channel devices M64 and M65 and n-channel devices M66 and M67 is a simple current mirror circuit enabled by p-channel device M69 being off (PDB high, derived from inverter I4) and n-channel device M68 being off (PD low) that generates the discharge sink current to PKDETOUT that determines the "release" time of the automatic attenuator. If the signal level is high then MN6 will be off. The current sources MP6 and MP7 then force equal currents into the resistors R1, R2 and R3, R4. Therefore, VCON and VMOV are equal and the gain of the ATOATT block will be 0 dB as will be described in the following sections.

When the attenuation function is enabled then MP7, MP8, MP9, MP10, MN6, MN7, MN8 and CC form a typical CMOS opamp. The input pair consists of MP9, MP10 while the output devices consist of MP7 and MN6. The closed loop gain is well controlled by the resistor ratio (R3+R4)/R4 since the resistors are well matched. The input to the opamp is the peak detector PKDETOUT and it is gained up with respect to analog ground since the bottom of R4 is connected to AGND. This is necessary since all signals in the chip are referenced to AGND. When the peak detector output begins to approach the AGND level, the device MN6 begins to turn on. This means that current is diverted away from R3, R4 and thus VMOV begins to fall. Therefore, when the voice signal is small enough there will be no current in R3, R4 so that VMOV will equal AGND and the ATOATT gain will be −6 dB as will be described later.

Another desirable feature of the circuit is that when MN6 is off, the voltage VMOV is automatically clamped to a value equal to VCON since the current sources MP6 and MP7 force equal currents into identical resistor loads and none of the current from MP7 is diverted away from resistors R3 and R4. With the op amp circuit the gain is well controlled with a resistor ratio whereas with comparator implementations the gain is not well controlled. The result is that the transition between the 0 dB and −6 dB regions is well controlled. The transition point also has a strong effect on the "attack" and "release" times. It was desirable to set the transition point just above the expected peak noise level so that the −6 dB gain is not applied to much of the signal range. This is another reason for maintaining a well controlled transition point.

Figure 10:
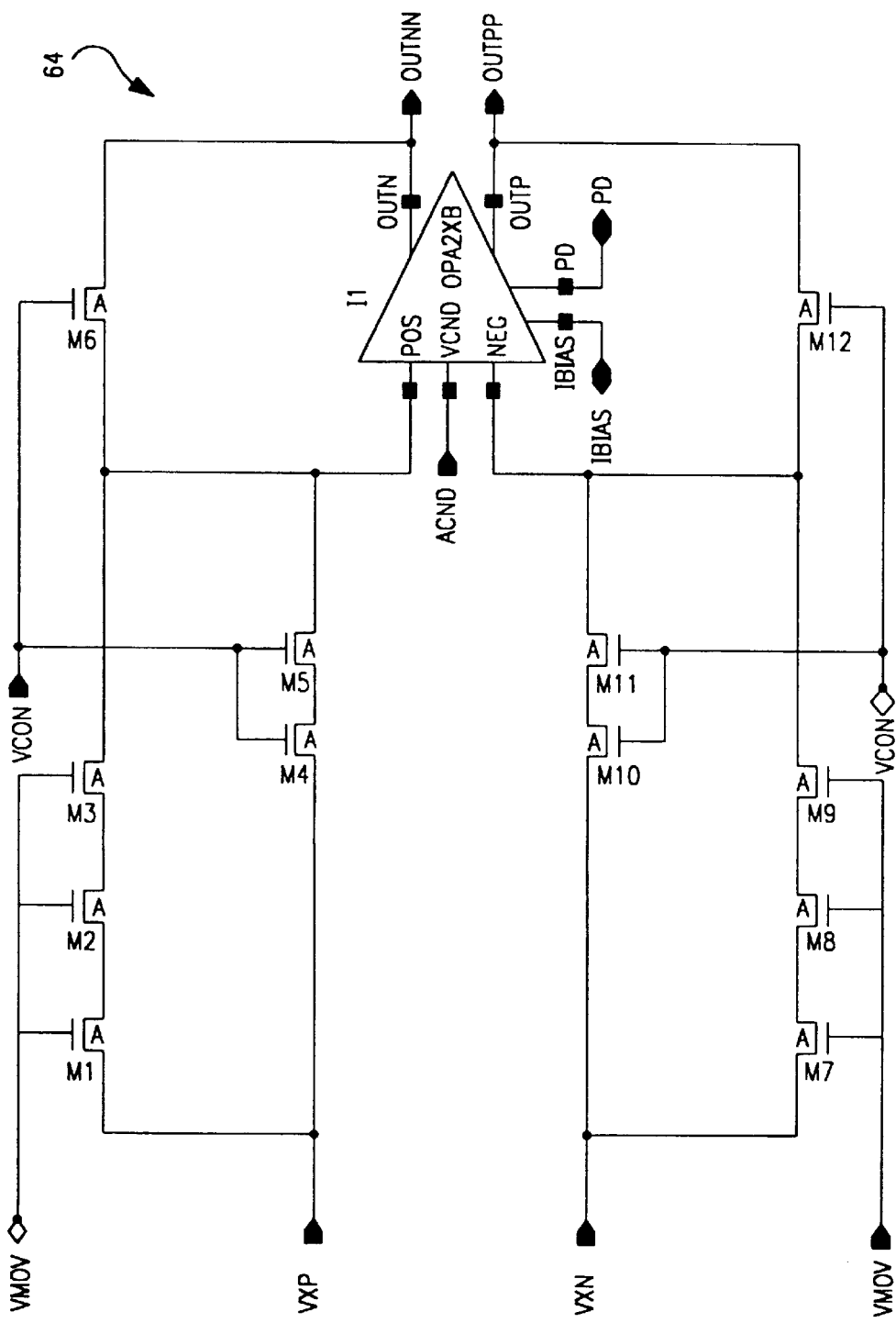
FIG. 10 is a detailed diagram of the attenuator 64 of FIG. 7.

FIG. 10 illustrates a detailed block diagram of the attenuator ATOATT 64. The attenuator 64 is a fully differential (differential input, differential output) inverting amplifier. Resistors are implemented by MOSFET's M1 through M12 so that their resistance values can be controlled by their gate voltages. The "on" resistances of these devices vary with the signal level which can cause distortion. However, the fully differential nature of the attenuator 64 tends to minimize second order harmonic distortion and is the reason for using this topology.

The voltage VMOV is equal to VCON when no attenuation is required. Under these conditions, the resistance of devices M1, M2 and M3 in parallel with devices M4 and M5 is equal to the resistance of device M6, and thus the gain is 0 dB. When the signal level is very low, VMOV drops to a level such that the total resistance of devices M1, M2 and M3 is large compared to the total resistance of devices M4 and M5. Therefore, the resistance of devices M1, M2 and M3 in parallel with devices M4 and M5 is approximately equal to the total resistance of devices M4 and M5. The devices M4, M5 and M6 are chosen to be equal so the gain is −6 dB. There is of course a transition region between these two extreme gain states of 0 dB and −6 dB. The voltage VCON is chosen to give adequate signal range without too much distortion while maintaining adequate "on" resistance so that the MOSFET's are easy to drive.

Because of the analog system used in the present invention, the invention is further useful for implementing a digital memory integrated circuit where the implementation of the digital memory is such that the digital information is encoded as analog information such as voltage levels to be stored in the nonvolatile cells of the analog memory array. Such encoding can be done off the memory chip by a digital to analog converter, or the chip could be modified to provide such encoding on the memory chip. The digital information is recovered from the analog storage array by presenting the analog levels from the nonvolatile analog storage array to an analog to digital converter and outputting the digital information such as a nibble or byte or other combination of digital information. As is the case with the digital to analog converter, the analog to digital converter also may or may not be fabricated on the same integrated circuit as the nonvolatile analog memory array and analog recording apparatus.

The implementation of the fixed gain amplifier 16 of FIG. 6 provides attenuation of internal analog ground noise while rejecting noise due to differences between the signal ground and the integrated circuit ground.

The implementation of the automatic attenuator assembly 24 of FIG. 7 requires only low value external capacitors and no resistors. In addition, the attack and release times of the assembly 24 are well controlled by use of a novel scheme and good control is achieved through the use of zero temperature coefficient charge and discharge currents. The transition region is also controlled by using a novel amplifier scheme which also automatically clamps the output level. No separate clamp circuit is needed. The attack time is also controlled by the peak detector that has an unusual scheme to control the output current. While the attack time is normally set by an RC circuit, in the present invention, a constant current output is used. The clamping scheme used in the ATTCTRL block 62 can also be used in most general situations where a voltage needs to be clamped. The circuit could also be turned around to clamp at a low level.

While the preferred embodiment of the present invention has been disclosed and described herein in detail, it will be obvious to those skilled in the art that various changes in form and detail may be made therein without departing from the spirit and scope thereof.

What is claimed is:

1. A nonvolatile integrated circuit analog storage device having the capability of receiving, repetitively sampling, storing and reproducing an analog input signal comprising:
   a first circuit for sampling an analog signal;
   a plurality of analog storage cells coupled to the first circuit, for storing samples of the analog signal; and
   a second circuit for reading out the stored samples of the analog signal to reconstruct the analog signal, the second circuit including an attenuator for attenuating noise in the reconstructed analog signal when the reconstructed analog signal is below a predetermined threshold.

2. The device of claim 1, further comprising:
   an interface circuit coupled to the first circuit, the second circuit and the plurality of analog storage cells; and
   a microcontroller coupled to the interface circuit for controlling the sampling and storage of the analog signal and the reading of the stored samples.

3. The device of claim 2, wherein the microcontroller provides a clock signal for synchronizing data transfer into the first circuit and out of the second circuit.

4. The device of claim 2, wherein the interface circuit comprises:
   an input shift register for receiving control and address information from the microcontroller;
   a logic circuit coupled to the input shift register for receiving the control information, the logic circuit generating an output signal in response to the control information;
   an address circuit coupled to the input shift register and to the logic circuit receiving the address information from the input shift register in response to the output signal; and
   an output shift register coupled to the logic circuit and to the address circuit, the address circuit providing the address information to the output shift register in response to the output signal.

5. The device of claim 4, wherein the control information and address information include information for initiating reading of the stored samples at a specified address.

6. The device of claim 4, wherein the control information and address information include information for initiating reading of the stored samples at a next available address.

7. The nonvolatile integrated circuit analog storage device of claim 1, wherein the second circuit further comprises a peak detector coupled to the attenuator that determines if the read samples of the analog signal are below a predetermined threshold, the peak detector generating a signal if the read samples of the analog signal are below a predetermined threshold, wherein the attenuator attenuates the read samples of the analog signal in response to the signal.

8. The nonvolatile integrated circuit analog storage device of claim 1, wherein in a high speed read mode, the second circuit reads the stored samples, compares each stored sample with a reference voltage, and shifts out the result of the comparisons at high speed.

9. The nonvolatile integrated circuit analog storage device of claim 1, wherein the input signal includes a first portion and a second portion, the device further comprising a fixed gain amplifier that has a first input terminal, a second input terminal and an output terminal, the first input terminal being coupled to receive the first portion of the input signal via a first resistor, the output terminal being coupled to the first input terminal via a second resistor, the second input terminal being coupled to receive the second portion via a third resistor, the second input terminal also being coupled to a ground terminal via a fourth signal.

10. The nonvolatile integrated circuit analog storage device of claim 9, wherein the input signal is a differential input signal.

11. A method of recording and playback of messages of varying length, comprising the steps of:
   (a) sampling an analog signal;
   (b) storing samples of the analog signal in a plurality of analog storage cells;
   (c) reading out the stored samples of the analog signal to reconstruct the analog signal; and
   (d) attenuating noise in the reconstructed analog signal when the reconstructed analog signal is below a predetermined threshold.

12. The method of claim 11, further comprising the step of providing a microcontroller for controlling the sampling of the analog signal and the reading out of the stored samples.

13. The method of claim 12, wherein the microcontroller provides a clock signal for synchronizing sampling of the analog signal and reading out of the stored samples.

14. The method of claim 12, further comprising the steps of:
   providing an input shift register for receiving control and address information from the microcontroller;
   providing a logic circuit coupled to the input shift register for receiving the control information, the logic circuit generating an output signal in response to the control information;
   providing an address circuit coupled to the input shift register and to the logic circuit receiving the address information from the input shift register in response to the output signal; and
   providing an output shift register coupled to the logic circuit and to the address circuit, the address circuit providing the address information to the output shift register in response to the output signal.

15. The method of claim 14, wherein the control information and address information include information for initiating reading of the stored samples at a specified address.

16. The method of claim 14, wherein the control information and address information include information for initiating reading of the stored samples at a next available address.

17. The method of claim 11, wherein step (d) further comprises the steps of:
   (d.1) determining if the read samples of the analog signal are below a predetermined threshold;
   (d.2) generating a signal if the read samples of the analog signal are below a predetermined threshold; and
   (d.3) attenuating the read samples of the analog signal in response to the signal.

18. The method of claim 11, wherein step (c) comprises the steps of:
   (c.1) reading the stored samples during a high speed read mode;
   (c.2) comparing each stored sample with a reference voltage; and
   (c.3) shifting out the result of the comparisons at high speed to reconstruct the analog signal.

19. The method of claim 11, further comprising the step of amplifying the analog signal prior to step (a).

20. A nonvolatile integrated circuit analog storage device having the capability of receiving, repetitively sampling, storing and reproducing an analog input signal comprising:
   a first circuit that samples an analog signal;
   a plurality of analog storage cells coupled to the first circuit, that stores samples of the analog signal;
   a second circuit that reads out the stored samples of the analog signal to reconstruct the analog signal;
   an interface circuit coupled to the first circuit, the second circuit and the plurality of analog storage cells; and
   a microcontroller coupled to the interface circuit that controls the sampling and storage of the analog signal and the reading of the stored samples, the microcontroller providing the addresses of the stored samples prior to reading of the stored samples, the microcontroller also providing addresses of the analog storage cells that are available for storage of samples of the analog signal.

21. The device of claim 20, wherein in a high speed read mode, the second circuit reads the stored samples, compares each stored sample with a reference voltage, and shifts out the result of the comparisons at high speed.

22. The device of claim 20, wherein the microcontroller provides a clock signal for synchronizing data transfer into the first circuit and out of the second circuit.

23. The device of claim 20, wherein the interface circuit comprises:
   an input shift register for receiving control and address information from the microcontroller;
   a logic circuit coupled to the input shift register for receiving the control information, the logic circuit generating an output signal in response to the control information;
   an address circuit coupled to the input shift register and to the logic circuit receiving the address information from the input shift register in response to the output signal; and
   an output shift register coupled to the logic circuit and to the address circuit, the address circuit providing the address information to the output shift register in response to the output signal.

24. The device of claim 22, wherein the control information and address information include information for initiating reading of the stored samples at a specified address.

25. The device of claim 22, wherein the control information and address information include information for initiating reading of the stored samples at a next available address.

26. The device of claim 20, wherein the input signal includes a first portion and a second portion, the device further comprising a fixed gain amplifier that has a first input terminal, a second input terminal and an output terminal, the first input terminal being coupled to receive the first portion of the input signal via a first resistor, the output terminal being coupled to the first input terminal via a second resistor, the second input terminal being coupled to receive the second portion via a third resistor, the second input terminal also being coupled to a ground terminal via a fourth signal.

27. The nonvolatile integrated circuit analog storage device of claim 26, wherein the input signal is a differential input signal.

* * * * *